United States Patent [19]
Whittaker

[11] 4,248,909
[45] Feb. 3, 1981

[54] CHAOITE COATING PROCESS

[75] Inventor: Arthur G. Whittaker, Woodland Hills, Calif.

[73] Assignee: The Aerospace Corporation, El Segundo, Calif.

[21] Appl. No.: 95,851

[22] Filed: Nov. 19, 1979

[51] Int. Cl.³ .................. G02B 1/10; C03C 17/22
[52] U.S. Cl. .................. 427/162; 427/53.1; 427/164; 427/166; 427/249
[58] Field of Search ............ 427/53.1, 162, 166, 427/249, 164

[56] References Cited

U.S. PATENT DOCUMENTS

| 3,733,394 | 5/1973 | Whittaker | 204/173 X |
| 3,904,505 | 9/1975 | Aisenberg | 204/298 |

Primary Examiner—James R. Hoffman
Attorney, Agent, or Firm—Francis R. Reilly

[57] ABSTRACT

A hard, transparent optical coating is formed on selected substrates by a deposition process in which carbon gas is quenched by and condenses on the substrate surface. The coating consists of one of the crystalline linear carbon forms, collectively known as carbynes, characterized by its hardness, stability, high refractive index and low optical absorption. The principal applications of the coating are for protective optical layers, and as antireflection or optical corrective films.

5 Claims, 2 Drawing Figures

CHAOITE COATING PROCESS

STATEMENT OF GOVERNMENT INTEREST

The invention described herein may be manufactured and used by or for the Government of the United States for governmental purposes without the payment of royalty therefor.

BACKGROUND OF THE INVENTION

The present invention relates to a method of depositing a thin film of a diamond-like form of carbon on the surface of a substrate.

There is continuing interest in the formation of diamond-like films as protective coatings on substrates such as lens and other optical elements. These films are attractive by virture of their inherent physical properties of hardness, inertness, transparency and high refractive index.

One method of depositing a diamond-like film on a substrate is described by S. Aisenberg in his U.S. Pat. No. 3,904,505 issued Sept. 9, 1975. This method employs a technique, generally referred to as ion beam deposition, wherein an energetic beam of carbon ions is created and extracted into a low pressure deposition chamber and accelerated to the surface of the substrate. Precise identification of the films produced by the Aisenberg method has not been reported. It is theorized that the film is heterogeneous, being made up of the several linear forms of allotropic carbon now generically referred to as carbynes. It can be said, in general, that of all known processes for producing diamond-like or carbyne films none results in a film of a selected one of the carbynes, but rather all such films are formed without control on the specific carbyne content.

In my prior work reported in the literature, it was noted that high temperature carbon gas when quenched on the surface of a cool substrate forms a silvery deposit. This deposit included an abundance of the carbyne known as chaoite and also several of the other carbynes. In my prior U.S. Pat. No. 3,733,394, issued May 15, 1973, a similar silvery deposit of chaoite was deposited on the surface of a heated graphite rod. My prior work however did not recognize that by closely controlling the temperature range of the carbon gas at which it was quenched, a single specie of the carbynes would be formed. In addition to the carbynes there were undoubtedly present in these deposits other forms of carbon including glassy carbon and graphite.

SUMMARY OF THE INVENTION

The present invention provides a method by which a thin film of a selected one of the carbynes is deposited on a substrate by quenching and condensing gaseous carbon from a temperature in the range of 2600°–2800° K. in an oxygen containing atmosphere at a pressure of 100–200 microns of mercury. Gaseous carbon is generated by laser heating a zone of a graphite rod to a temperature of about 3000° K., or more, at which it subimes. The gaseous carbon expands and cools as it flows away from the graphite rod. The substrate to be coated is mounted so as to be exposed to the carbon gas at the distance from the rod where the gas temperature is reduced to a temperature in the range of 2600° to 2800° K. The surface of the substrate facing the carbon rod remains moderately cool (120°–180° C.). Upon impingement on the substrate surface the carbon gas is quenched to solidify as a carbyne film. The specific carbyne (linear carbon allotrope) is identified herein as carbyne 1. Present analytic results show that carbyne 1 is the allotrope known as chaoite. In the event the carbon gas is quenched from a temperature of between 2800°–3000° K., the film deposited is carbyn 2 which is physically similar to carbyn 1. Since the temperature of the gases impinging on the substrate surface may vary across the ranges of 2600°–2800° K. and 2800°–3000° K., the film may comprise a combination of carbynes 1 and 2.

The quenching process is normally carried out for a period ranging up to about 10 minutes, depending on the film thickness desired, 0.1 to 2.5 $\mu$m. The carbyne film is characterized by its hardness (greater than boron carbide), chemical stability, high refractive index, low optical absorption and good adhesion to many metals, certain plastics, glass, and several of the non-metallic crystalline solids as sapphire, calcium fluoride and potassium chloride.

The physical properties of the chaoite coating make it particularly attractive as a protective coating for lenses and other optical applications.

BRIEF DESCRIPTION OF THE DRAWINGS

The features and advantages of the presently preferred embodiment of the invention will be more fully understood by the following detailed description taken in conjunction with the accompanying drawings in which.

DETAILED DESCRIPTION

Figure 1:
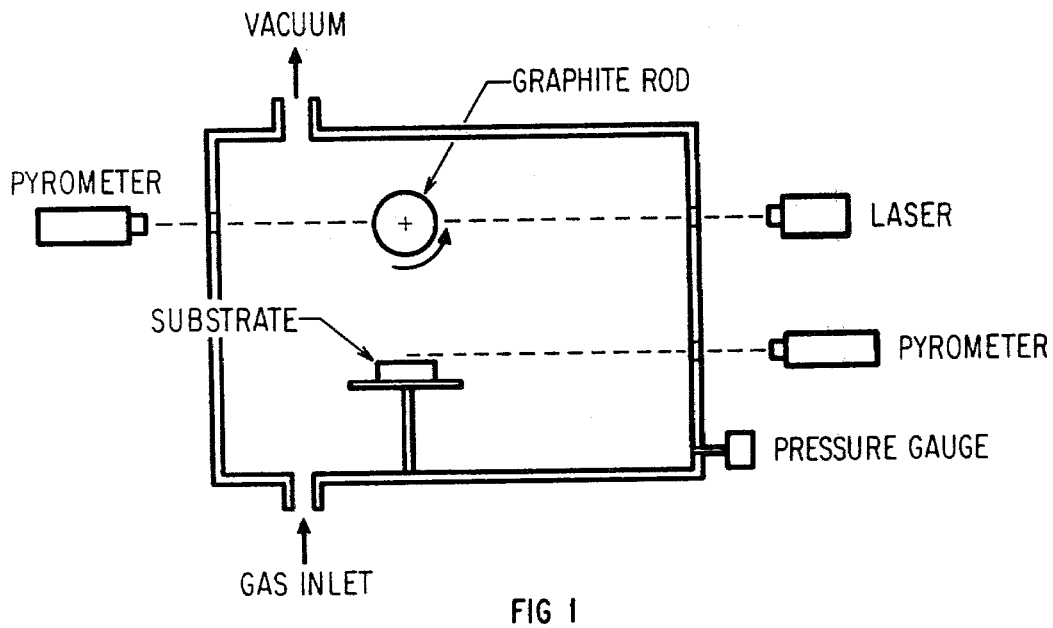
FIG. 1 is a block-diagram representation of the apparatus used in the practice of the present invention.

In FIG. 1 is shown in schematic form the apparatus useful in the performance of the present invention. This apparatus has been used in my studies establishing the phase diagram of FIG. 2 and is more fully described in technical report number SAMSO-TR-76-133, dated July 7, 1976, entitled "A System Employing Laser Heating for the Measurement of High-Temperature Properties of Materials Over a Wide Pressure Range" available from the National Technical Information Service.

The apparatus includes a vacuum chamber (unnumbered) in which an anisotropic pyrolytic graphite rod is mounted to be rotatively driven in the indicated direction at high speed (40,000 rpm). The heat conducting axis of the graphite rod is radially thereof and its non-heat conducting axis is longitudinally of the axis of rotation. A narrow band of the graphite rod is heated by a laser with its beam focused onto the rod with a 3.5 mm diameter spot. The temperature of the heated band of the graphite rod is sensed by a pyrometer viewing the rod from a point diametrically opposite the point of laser heating. The substrate to be coated with a chaoite coating is positioned on a support table (unnumbered) so that the substrate surface facing the heated band of the graphite rod is removed therefrom approximately a few centimeters. The support table is preferably adjustable in height to enable the standoff distance between the substrate and the graphite rod to be varied. The upper surface region of the substrate is viewed by a pyrometer to measure the temperature of gases impinging on the substrate. The vacuum chamber is exhausted via a vacuum line as indicated and a gas inlet is provided to admit a small volume of oxygen containing gas to the interior of the vacuum chamber. Pressure within the chamber is measured by a conventional pressure gauge.

Figure 2:
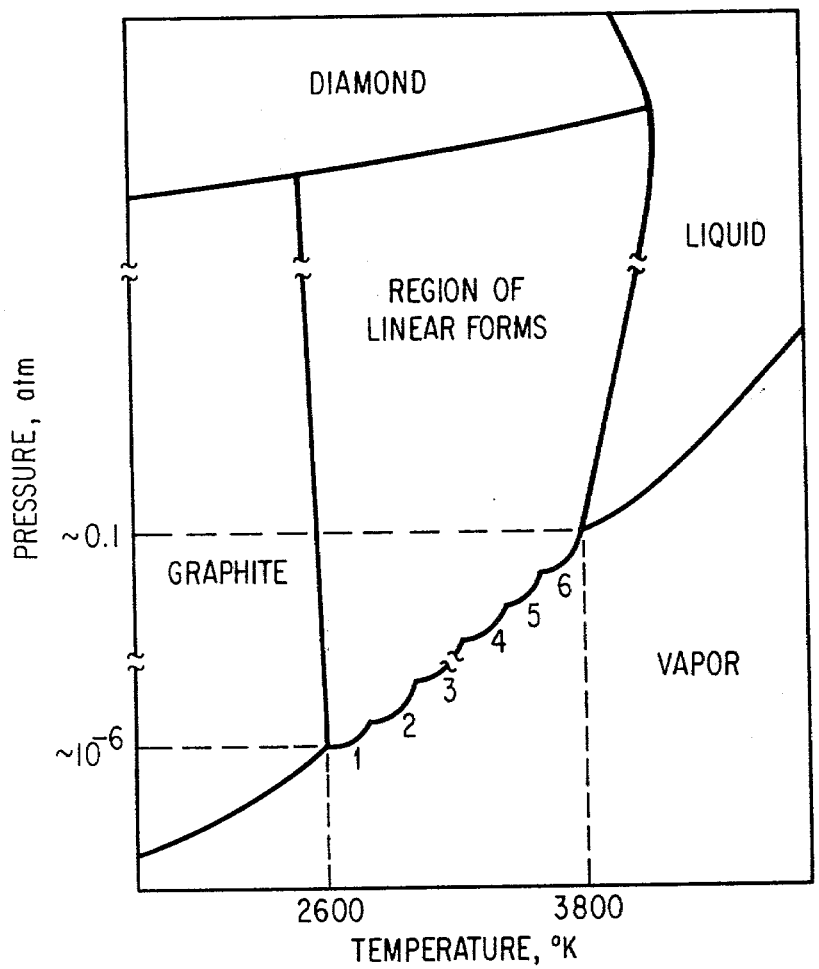
FIG. 2 is the solid-liquid-vapor phase diagram of carbon (graphite).

With the apparatus in operation, the graphite rod is heated to a vaporization temperature of 3000° K. or more with the chamber being substantially evacuated. The carbon vapor expands in a plume and cools in flowing away from the graphite rod. The substrate to be coated with a film of chaoite is positioned to have the carbon vapor impinge on its surface within the temperature range of 2600°–2800° K. The substrate is only moderately heated by radiation from the graphite rod and the surface temperature of substrate will normally not exceed temperatures of 120°–180° C. The pressure of the carbon vapor at the substrate surface is maintained at 100–200 microns of mercury ($\sim 10^{-6}$ atm.). As shown in FIG. 2, hereinafter described, the carbon vapor within the above temperature and pressure ranges is immediately adjacent the solid-vapor transition of the carbyne identified by numeral 1. This carbyne is chaoite.

The carbon vapor upon striking the cool substrate surface is instantaneously in the solid form, carbyne 1 or chaoite. The vapor deposition by quenching is continued until a film of chaoite of the desired thickness is deposited. The maximum desirable thickness of 2.5 μm is normally attained after a 10 minute period.

Referring to FIG. 1 of the drawing, there is shown the solid-liquid-vapor phase diagram for carbon (graphite) as established by experiments conducted by the use of the apparatus of FIG. 1. As solid graphite is elevated in temperature, it remains stable up to approximately 2600° K. Therebeyond the graphite undergoes several transformations into other crystal forms of carbon at the higher temperatures at low pressures. These other crystal forms are carbon linear polymorphs generically termed carbynes. In the phase diagram, the different carbynes are numbered 1 through 6, each having a temperature band of approximately 200° K. within the overall band of 2600° K. to 3800° K. The present invention is primarily concerned with films of the carbynes 1 and 2. My present data on the crystal lattice of carbyne 1 indicates it is the polymorph identified as chaoite and that carbyne 2 is that form known as carbon VI. These two polymorphs have similar physical properties and the uncertainties of analytic techniques render it difficult to distinguish which is being formed.

The principal feature of the present invention is the discovery that the continuous quick quenching of vapor state of carbon at its indicated pressure and temperature regime for a limited period of time, up to about 10 minutes, forms a thin stable film of chaoite. The quenching is accomplished by the impingement of the vapor phase on the cool surface of a substrate desired to be coated with the film. The maximum and minimum temperature of the vapor phase when quenched must be controlled with precision. At lower temperatures (less than 2600° K.) the vapor will deposit out in its original carbon form. If the temperature is permitted to vary over a bandwidth at an upper limit above 3100° K., the film will include the higher linear polymorphs of carbon detracting from the preferable physical qualities of chaoite or carbyne 1. A heterogenous film made up of a combination of all or most of the carbynes 1 through 6 will have variable absorptivity in the visible spectrum, hardness, brittleness and adherence to the substrate.

Having described the present invention with respect to the formation of a chaoite film, it will become apparent to those skilled in the art that the invention may be practiced with modifications thereto without departing from the spirit of this invention. As for example other single carbyne films may be deposited by adjusting the specific range of pressure and temperature characteristic of such of the other individual carbynes.

What is claimed is:

1. The process for forming a film on a substrate surface, said film consisting of one of the carbyne forms of carbon comprising the steps:
    (a) heating carbon to a temperature in the range of 2800° K. to 3200° K., in a closed partially evacuated chamber whereby to produce gaseous carbon at a temperature within the said range, the temperature of said gaseous carbon declining upon expansion away from carbon being heated;
    (b) subjecting the surface of the substrate to the gaseous carbon onto which the film is to be formed, said surface being oriented facewise toward the carbon being heated, and said surface being located at a distance from the carbon being heated whereat the gaseous carbon is reduced to a temperature in the approximate range of 26000°–2800° K. whereby the carbon gas is quenched on and by said surface to form the thin film consisting of carbyne.

2. The process as defined in claim 1 wherein step (b) is carried out for a period of time of approximately 10 minutes.

3. The process as defined in claim 1 wherein step (b) is continued until the thickness of the film attains a thickness of 0.1 to 2.5.

4. The process as defined in claim 1 wherein the gaseous carbon is at a pressure of 100 microns to 200 microns at the surface of the substrate.

5. The process as defined in claim 4 wherein the pressure is partially maintained by the presence of an oxygen containing gas.

* * * * *

UNITED STATES PATENT OFFICE
CERTIFICATE OF CORRECTION

PATENT NO. : 4,248,909
DATED : February 3 1981
INVENTOR(S) : Arthur G. Whittaker It is certified that error appears in the above-identified patent and that said Letters Patent are hereby corrected as shown below:

Claim 3, line 3 after "2.5" insert --$\mu$m--

Signed and Sealed this

Twenty-first Day of July 1981

[SEAL]

Attest:

Attesting Officer

GERALD J. MOSSINGHOFF

Commissioner of Patents and Trademarks